US008358526B2

(12) United States Patent
Shepard

(10) Patent No.: US 8,358,526 B2
(45) Date of Patent: Jan. 22, 2013

(54) DIAGONAL CONNECTION STORAGE ARRAY

(75) Inventor: Daniel R. Shepard, North Hampton, NH (US)

(73) Assignee: Contour Semiconductor, Inc., N. Billerica, MA (US)

(*) Notice: Subject to any disclaimer, the term of this patent is extended or adjusted under 35 U.S.C. 154(b) by 821 days.

(21) Appl. No.: 12/395,071

(22) Filed: Feb. 27, 2009

(65) Prior Publication Data

US 2009/0219741 A1    Sep. 3, 2009

Related U.S. Application Data

(60) Provisional application No. 61/067,494, filed on Feb. 28, 2008.

(51) Int. Cl.
*G11C 5/06* (2006.01)

(52) U.S. Cl. .. 365/63; 365/51; 365/185.05; 365/189.14; 365/189.19

(58) Field of Classification Search .................. 365/51, 365/63, 148, 230.01, 226, 230.06, 189.08, 365/189.09, 189.14, 189.19, 185.05, 185.12, 365/185.18
See application file for complete search history.

(56) References Cited

U.S. PATENT DOCUMENTS

| | | | |
|---|---|---|---|
| 4,112,505 A | 9/1978 | Duval et al. | |
| 5,615,163 A * | 3/1997 | Sakui et al. | 365/230.03 |
| 5,889,694 A | 3/1999 | Shepard | |
| 7,218,570 B2 * | 5/2007 | So et al. | 365/230.06 |
| 2007/0070710 A1 | 3/2007 | Takenaka | |

FOREIGN PATENT DOCUMENTS

| | | |
|---|---|---|
| EP | 1 420 408 A | 5/2004 |
| EP | 1 710 804 A | 10/2006 |
| WO | WO-2007-052426 A | 5/2007 |

OTHER PUBLICATIONS

Govyadinov et al., "Field Emitter with Focusing Column for Atomic Resolution Storage Device," Vacuum Nanoelectronics Conference 2004, *IEEE* (Jul. 10, 2005) pp. 334-335.
International Search Report and Written Opinion for PCT/US2009/035505, mailed Jul. 2, 2009.
International Preliminary Report on Patentability, PCT/US2009/035505, Sep. 10, 2010, 9 pages.

* cited by examiner

*Primary Examiner* — Richard Elms
*Assistant Examiner* — Hien Nguyen
(74) *Attorney, Agent, or Firm* — Bingham McCutchen LLP

(57) ABSTRACT

In one aspect, an electronic memory array includes overlapping, generally parallel sets of conductors, and includes storage elements near each point of overlap. One set of conductors has a non-negligible resistance. An address path for each storage element traverses a portion of one each of the first and second sets of conductors and a selectable resistance element. All storage element address paths have substantially equivalent voltage drops across the corresponding storage elements.

21 Claims, 5 Drawing Sheets

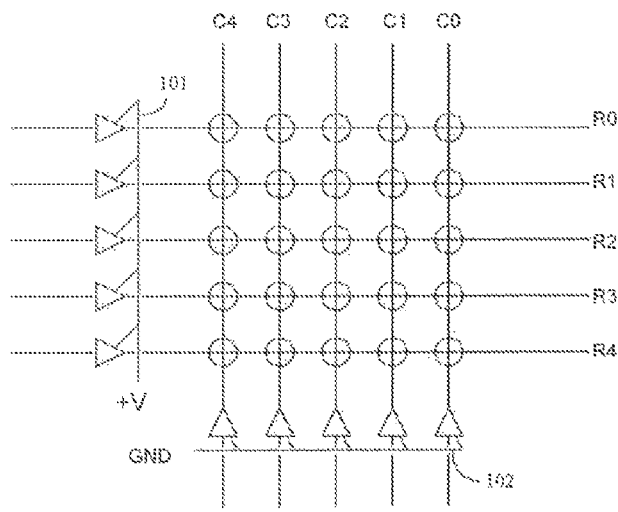
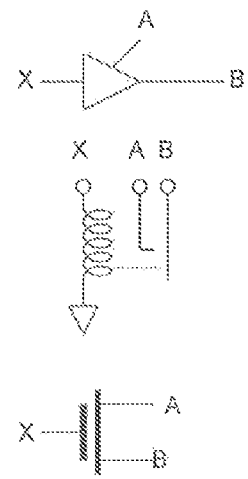
FIGURE 1a
FIGURE 1b
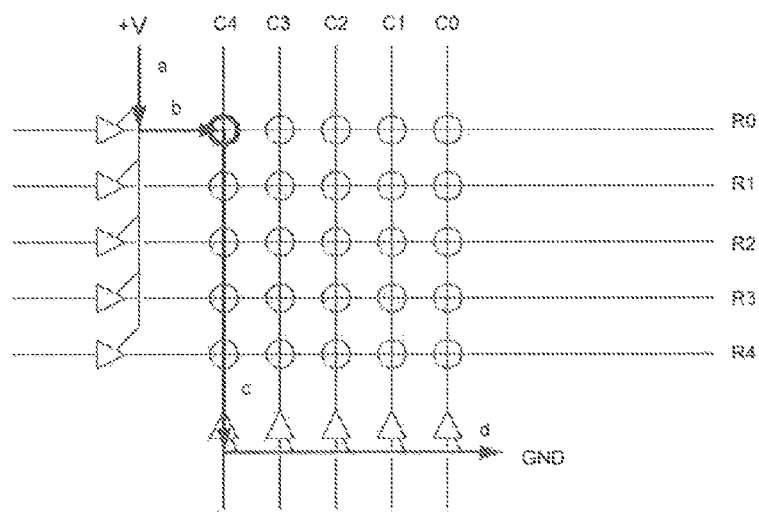
FIGURE 2

DIAGONAL CONNECTION STORAGE ARRAY

CROSS REFERENCE TO RELATED APPLICATIONS

This application claims the benefits of U.S. Provisional Patent Application Ser. No. 61/067,494, filed on Feb. 28, 2008, which is incorporated herein by reference in its entirety.

FIELD OF THE INVENTION

The present invention relates to information storage cells and, more particularly, systems and methods for reading and writing information storage cells.

BACKGROUND

Many types of non-volatile storage arrays exist in the prior art that require specific voltages to write data into the array and that use very low currents and/or voltages to read data out of the array. As photolithographic geometries shrink, the smaller storage cells formed at each array storage location carry less current. As a result, the array read and write voltages and currents also decrease and must be controlled with increasing precision.

Furthermore, the reduction in geometries causes the resistance of conductors in the array—e.g., array row and column lines—to increase and to become non-negligible in relation to the read and write voltages and currents. Unlike larger-geometry arrays, in which the resistances and resultant voltage drops of row and column lines are insignificant compared to the supply voltages and may be ignored, the voltage drops on row and column lines in reduced-geometry arrays may be a significant percentage of the supply voltage. The combination of low read and write currents and/or voltages, along with higher line resistances, makes reading and writing to the array more difficult due to the increased internal array voltage drops.

For example, when writing a bit to the array, whether the storage element is a fuse, antifuse, phase change material, or other storage element, and particularly when the storage location is to hold more than one bit per cell, the voltage applied to the cell must typically fall within a precise tolerance. Depending on the distance traveled along a given row and a given column, however, the write voltage applied to a storage cell may vary. The write voltage applied to a storage cell that is located far from a write driver, for example, may be less than the write voltage applied to a closer storage cell; the lower voltage may be outside a tolerance limit, causing the write to fail. Likewise, when reading from the array by, for example, sensing a voltage on a cell, the sensed voltage may be modified by the resistance along the read path and resultant voltage drop, causing the read to fail due to inadequate voltage. In addition, the current through a storage cell may be affected by the voltage across the cell, which, in turn, may be detrimentally affected by the voltage drops along the read path. Clearly, a need exists for a memory array storage device that can cope with the reduced read and write voltages and increased row and column resistances associated with reduced photolithographic geometries.

SUMMARY OF THE INVENTION

Embodiments of the present invention include a cross-point memory array storage device having connections for power and ground at opposite corners of the array, thereby creating a constant-distance path between each memory cell in the array and its corresponding read and write circuitry. Because the path to each memory cell is constant, the voltage drop along each line in the array is more predictable and controllable. In addition, when the row and/or column decoding circuitry is split and placed along both sides of the array, path switching compensates for this dual path access.

In general, in a first aspect, an electronic memory array includes a selectable resistance element and a first plurality of generally parallel conductors each having a non-negligible resistance. A second plurality of generally parallel conductors overlaps the first plurality of generally parallel conductors. A plurality of storage elements is each disposed proximate a point of overlap between the first and second pluralities of generally parallel conductors. An address path for each storage element traverses at least a portion of one of the first plurality of generally parallel conductors, at least a portion of one of the second plurality of generally parallel conductors, and the selectable resistance element. All storage element address paths have substantially equivalent voltage drops across the corresponding storage elements.

One or more of the following features may be included. The selectable resistance element may be a first power bus for receiving, at one end only, voltage from a first voltage source. A voltage potential on the first power bus may decrease with increasing distance from the first voltage source, and the first power bus may supply power to the first plurality of generally parallel conductors. The second plurality of generally parallel conductors may each have a non-negligible resistance, and a second power bus may receive, at one end only, voltage from a second voltage source. A voltage potential on the second power bus may decrease with decreasing distance from the second voltage source, and the second power bus may supply power to the second plurality of generally parallel conductors.

The selectable resistance element may be a multi-tap resistor controlled by an address decoder. First and second voltage sources may be disposed at diagonally opposite corners of the electronic memory array. The storage element may be a fuse, an antifuse, a phase change material, and/or a programmable field-emitter element. A first driver, which may include a field-effect transistor, may receive power from the first power bus and supply power to one of the first plurality of generally parallel conductors. A second driver, which may include a field-effect transistor and a signal sense circuit, may receive power from the second power bus and supply power to one of the second plurality of generally parallel conductors. The signal sense circuit may determine a state of the storage element at by sensing at least one of a current through and a voltage on the storage element.

A first driver may be disposed on a first side of the electronic memory array and a second driver may be disposed on a second, opposite side of the electronic memory array. The first and second drivers may provide power to the first plurality of generally parallel conductors, and the second voltage source may be connected to a first end of the second power bus when the first driver is active and to a second end of the second power bus when the second driver is active. The first and second drivers may provide power to the second plurality of generally parallel conductors, and the first voltage source may be connected to a first end of the first power bus when the first driver is active and to a second end of the first power bus when the second driver is active. The first power bus may have a resistivity per unit length approximately equal to that of one of the second plurality of generally parallel conductors, and the second power bus may have a resistivity per unit length approximately equal to that of one of the first plurality of generally parallel conductors.

In general, in another aspect, a method for addressing a storage element in an electronic memory array includes selecting one of a first plurality of generally parallel conductors each having a non-negligible resistance. One of a second plurality of generally parallel conductors overlapping the first plurality of generally parallel conductors is selected. One of a plurality of storage elements each disposed proximate a point of overlap between the first and second pluralities of generally parallel conductors is addressed, and a resistance is assigned to a selectable resistance element. An address path for each storage element traverses at least a portion of one of the first plurality of generally parallel conductors, at least a portion of one of the second plurality of generally parallel conductors, and the selectable resistance element. All storage element address paths have substantially equivalent voltage drops across the corresponding storage elements.

One or more of the following features may be included. The selectable resistance element may be a first power bus for receiving, at one end only, voltage from a first voltage source. A voltage potential on the first power bus may decrease with increasing distance from the first voltage source, and the first power bus may supply power to the first plurality of generally parallel conductors. The second plurality of generally parallel conductors may each have a non-negligible resistance. A second power bus may receive, at one end only, voltage from a second voltage source. A voltage potential on the second power bus may decrease with decreasing distance from the second voltage source, and the power bus may supply power to the second plurality of generally parallel conductors.

The selectable resistance element may be a multi-tap resistor controlled by an address decoder. First and second voltage sources may be disposed at diagonally opposite corners of the electronic memory array. The storage element may be at least one of a fuse, an antifuse, a phase change material, and a programmable field-emitter element. The method may further include switching the voltage received from the first voltage source from a first end of the first power bus to a second end of the first power bus based on a received column address, and may also further include switching the voltage received from the second voltage source from a first end of the second power bus to a second end of the second power bus based on a received row address.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which:

FIG. 1 illustrates a cross-point memory array circuit and switching components embodied therein;

FIG. 2 illustrates a cross-point memory array circuit addressing a top left cell;

DETAILED DESCRIPTION

Figure 3:
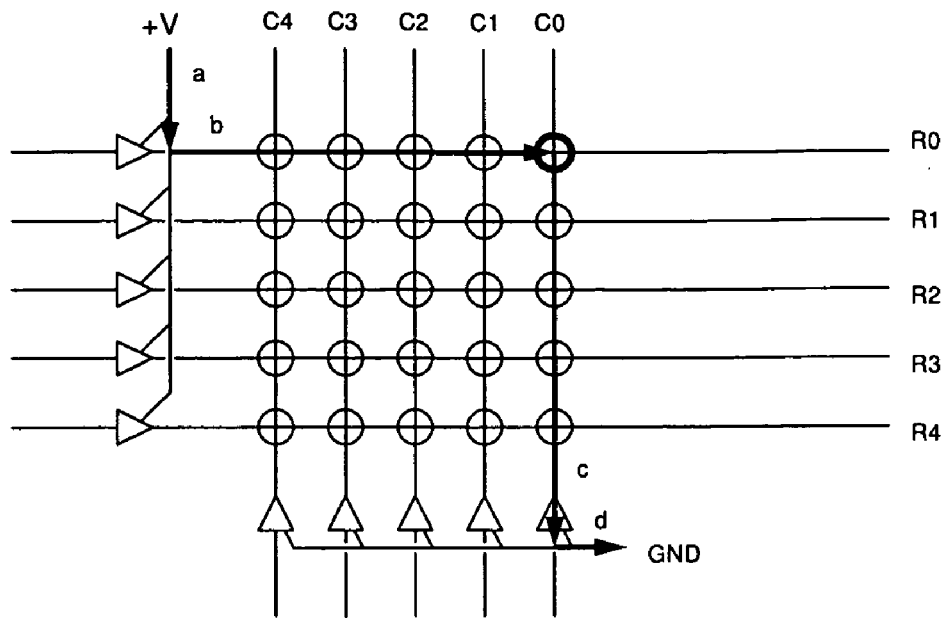
FIG. 3 illustrates a cross-point memory array circuit addressing a top right cell.

The present invention is a cross-point memory array storage device wherein the connections for power and ground are made at opposite corners of the array, causing the distance covered while accessing a given memory cell to be constant and thereby enabling the voltage drops along the lines in the array to be more predictable and controllable. In addition, when the row and/or column decoding circuitry is split and placed along both sides of the array, path switching compensates for this dual path access.

FIG. 1a depicts a cross-point memory array structure. An example of a diode-based cross-point memory array is described in U.S. Pat. No. 5,889,694. Storage cells in the array are present at the intersection of each wordline/row (R0-R4) and bitline/column (C4-C0). In this array, power for reading or writing (+V) may be applied to the array through a series of row drivers and ground (GND) may be applied through a series of column drivers. In various embodiments, the row drivers include a single FET and the column drivers include a driver FET and signal sense circuits such as, for example, diodes at the bit locations that have their anodes towards the rows and cathodes towards the columns. In one embodiment, a memory cell is addressed by applying +V to a given row and applying a path to GND to a given column.

The state of the bit at the intersection of the given row and the given column may be sensed as a current in the column driver or, alternatively, as a voltage level on the row or column, and/or as a current level on the row. In addition, the state of the bit may be sensed by driving the given row and column with a current that is affected by the state of the bit. FIG. 1b depicts the driver switch as a circuit schematic diagram, as an electromechanical switch (e.g., a normally opened relay), and as an NMOS FET, each with a control input X, a signal input A, and a signal output B. Many other possibilities for driver switches will be apparent to those skilled in the art. In these examples, a positive signal at X will electrically connect A and B; other polarity switches are also contemplated. In one embodiment, some or all of the components of the present invention are built as an integrated circuit.

FIG. 2 shows, in one embodiment, a cross-point memory array structure in which the row and column voltages are applied to diagonally opposite corners of the array. The row and column voltages may be +V and 0 volts (GND), respectively. One skilled in the art, however, will see that many other voltages or currents, both positive and negative, may be applied to the rows and columns. The power busses 101, 102 common to the row and column drivers may match the material and geometry as the columns and rows themselves, respectively. In one embodiment, the power busses 101, 102 have different materials and/or geometries than the columns and rows, but have similar resistivity. For example, a thicker and/or wider line will lower resistivity while a less conductive material will raise resistivity, and vice-versa.

FIG. 2 illustrates the access of a storage bit in the upper left corner of the array, corresponding to row R0 and column C4. The total path traveled by the current through the selected bit will see a voltage drop due in part to the inherent resistance of the row R0 and column C4 wiring. The vertical path (i.e., the total vertical distance travelled) is roughly equal to the traveled segment (a) of the +V power bus 101 plus the traveled segment (c) of the column C4. The horizontal path (i.e., the total horizontal distance traveled) is roughly equal to the traveled segment (b) of the row R0 plus the traveled segment (d) of the GND bus 102.

Referring to FIG. 3, the storage bit in the upper-right corner of the array is accessed using row R0 and column C0. When accessing this bit, the total path traveled by the current through the selected row R0, column C0, and bit will see a roughly constant voltage drop that is similar to the voltage drop applied to the storage bit in the upper-left corner (or any other bit in the array). As shown in FIG. 3, the vertical path-including the power bus segment (a) and the column segment (c)—is roughly similar to the distance covered by the corresponding segments (a) and (c) depicted in FIG. 2. Similarly, the horizontal path-including the row segment (d) and the ground bus segment (d)—is roughly similar to distance covered by the corresponding segments (d) and (b) depicted in FIG. 2.

Figure 4:
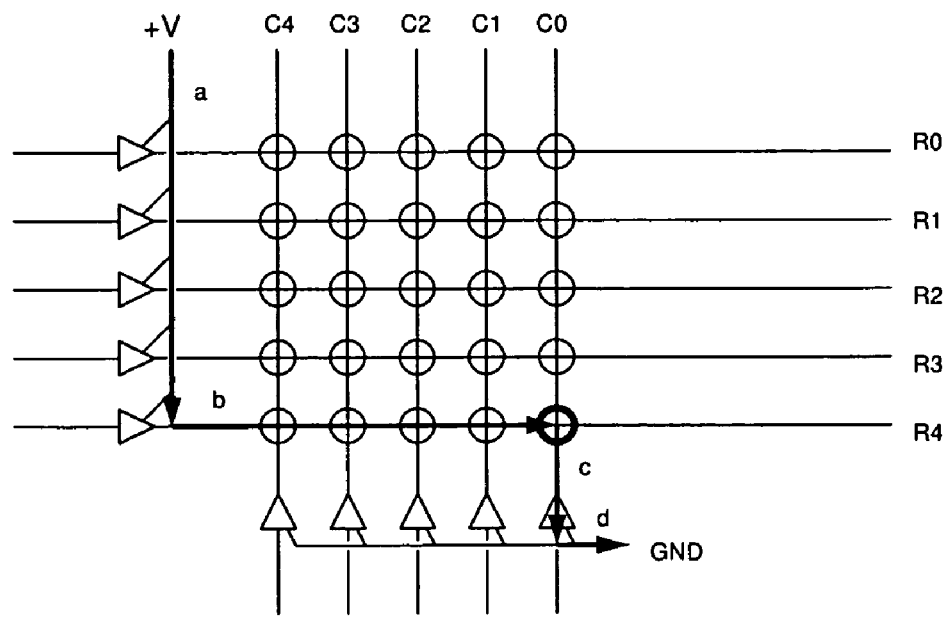
FIG. 4 illustrates a cross-point memory array circuit addressing a bottom right cell.
Figure 5:
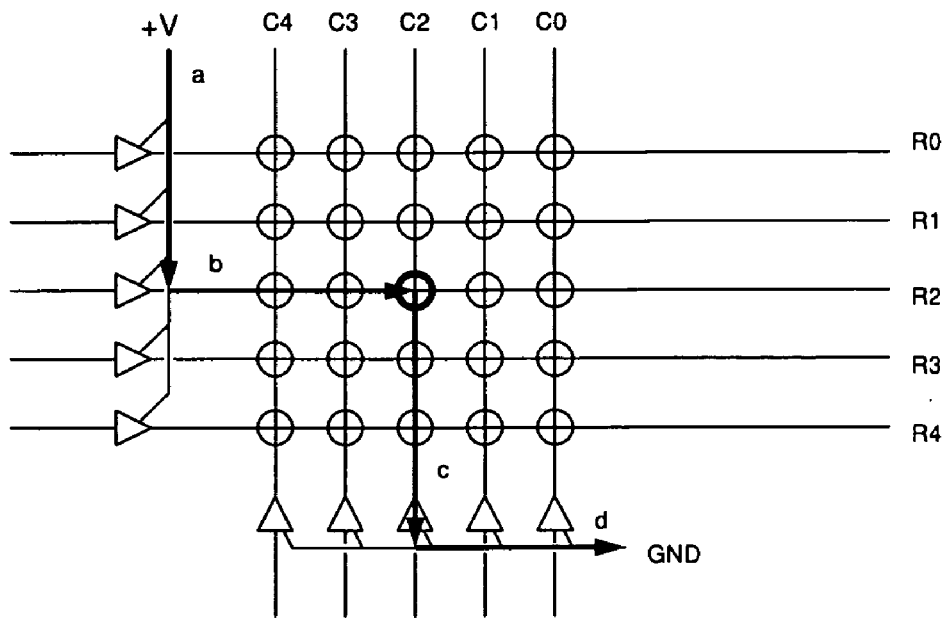
FIG. 5 illustrates a cross-point memory array circuit addressing a center cell.

FIGS. 4 and 5 depict the accessing of other storage locations in the array (row R4/column C0 and row R2/column C2, respectively. As can be seen, the vertical paths (segments (a) plus (c)) and horizontal paths (segments (d) plus (b)) are also similar in length to the vertical and horizontal paths depicted in FIGS. 2 and 3. In general, the length of the total path (horizontal plus vertical) is equal to the width of the array plus the height of the array. If (i) the resistivity of the power bus running parallel to the columns has generally the same resistivity as the columns and (ii) the resistivity of the power bus running parallel to the rows has generally the same resistivity as the rows, the total resistivity of the total path will remain generally consistent regardless of the bit selected.

In general, the path lengths within the array—i.e., row segments (b) and column segments (c)—determine how much additional path length (i.e., additional resistance) is necessary to maintain a constant resistance of the overall path. In the above embodiments, the additional path length is supplied by a row power bus segment (a) and a column power bus segment (d). The row and column power buses thus function as selectable resistance elements, wherein the length of the segments (a) and (d) determines the particular resistance assigned to a particular row/column address path. In other words, while the total resistance of each the power buses is fixed, different effective resistances may be selected by accessing the power buses at different points along their lengths, as determined by the lengths of the segments (b) and (c).

In other embodiments, the additional path length and additional resistance does not come from the power busses or other parts of the array. For example, the selectable resistance element may be, for example, a resistive line, multi-tap resistor, or varactor diode, and may be used to provide a resistance appropriate for the resistance of segments (a) and/or (d), in order to create constant-resistance address paths. The resistance element may be disposed at any point in the path, for example, between a power supply and a row or column driver or receiver, or between a row or column driver or receiver and a row or column line. The resistance of the selectable resistance element may be assigned by an output of the array's row and/or column decoder, wherein the output selects a resistance appropriate for the particular cell being selected. For example, a large resistance may be selected when a cell in the lower-left corner of the array is being addressed, and a small resistance may be selected when a cell in the upper-right corner of the array is being addressed.

Accordingly, the selectable resistance element may be a variable-resistance device, such as a varactor diode, wherein a control signal changes the resistance between the terminals, or a device with a fixed overall resistance that may be tapped at different locations or terminals to provide a selectable effective resistance. In one embodiment, the selectable resistance element is controlled by a decoder that is separate from the array decoder. In another embodiment, a separate decoder is used to select a segment of the row and/or column power bus.

Figure 6:
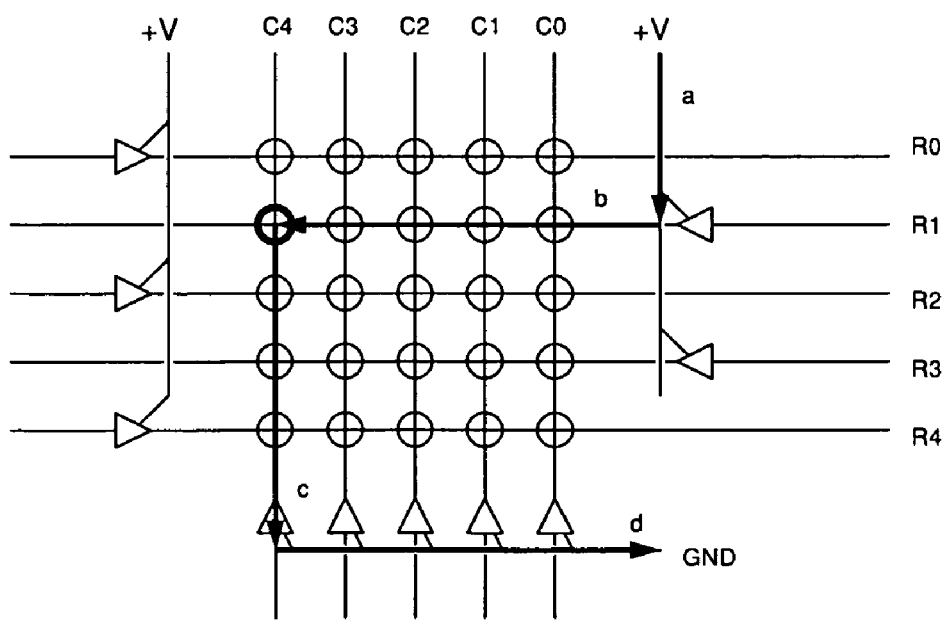
FIG. 6 illustrates a cross-point memory array circuit including split-row decoders without path switching.

Some memory array devices may have row and/or column driver components that are larger than the available pitch of the row and/or column lines. These memory array devices may place some of the row and column decoders on opposite sides of the array in order to increase the layout efficiency of the device. For example, a first half of the row decoders may be placed on the left side of the array and a second half on the right side of the array. Similarly, a first half of the column decoders may be placed above the array and a second half below the array. FIG. 6 depicts an array that has row drivers split between right and left sides of the array and a fixed GND connection on the right-hand side of the array. When the decoder selects a row (here, row R1) driven from the same side of the array as the GND connection, the path through the selected bit is no longer constant. Instead, the horizontal path length increases as the selected column is farther from the GND connection side. For example, the traveled segments (b) of row R1 and (d) of GND will be greater if column C4 is selected than if column C0 is selected.

Figure 7:
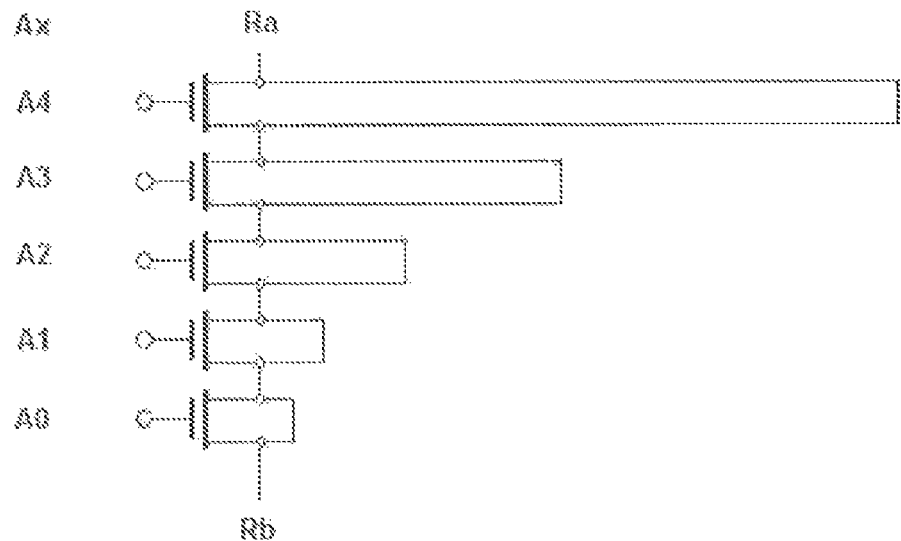
FIG. 7 illustrates a selectable resistance device.

FIG. 7 depicts a selectable resistance device having terminals Ra and Rb and control terminals Ax corresponding to address bits A0-A4. The resistance between Ra and Rb may be varied by asserting one or more of the control bits Ax. When all of the address bits A0-A4 are unasserted (or low), the path between Ra and Rb traverses the full length of the resistive loops on the right-hand side of the device. When an address bit is asserted (or high), however, it activates a corresponding FET on the left-hand side of the device, providing a shortened path through the FET between Ra and Rb and thereby lowering the total resistance between Ra and Rb. For example, the highest order address bit (i.e., the most significant bit or "MSB") selects either the near or far half of the array. In FIG. 7, the MSB is A4, which selects the topmost or longest loop in the device. If bit A4 is, for example, low, thereby selecting the near half of the array, the path between Ra and Rb includes the full length of the topmost loop. This full length corresponds to one half of the distance across the array, and is added into the address path to compensate for selecting a storage cell in the near half. If, on the other hand, bit A4 is high, the far half of the array is selected. In this case, additional resistance is incurred by decoding to a row or column that is more distant across the array, and, to compensate, bit A4 activates the topmost FET to correspondingly reduce the resistance between Ra and Rb. The rest of the address bits A0-A3 each work in the same way (e.g., once the near of far half of the array is selected, the next bit corresponds to whether that next bit decodes to divide the half of the array that is selected by the higher order bits, and so on).

In one embodiment, the selectable resistance device depicted in FIG. 7 is placed in series with the address path. A separate such circuit may be included for both dimensions of the array or a single circuit may include the address bits for both dimensions. Furthermore, the lowest order address bits may be excluded if the precision afforded by these bits is negligible. In one embodiment, the selectable resistance device may also be implemented for other applications in which path length or resistance compensation is required, such as applications where an address decode results in a path variation.

Figure 8:
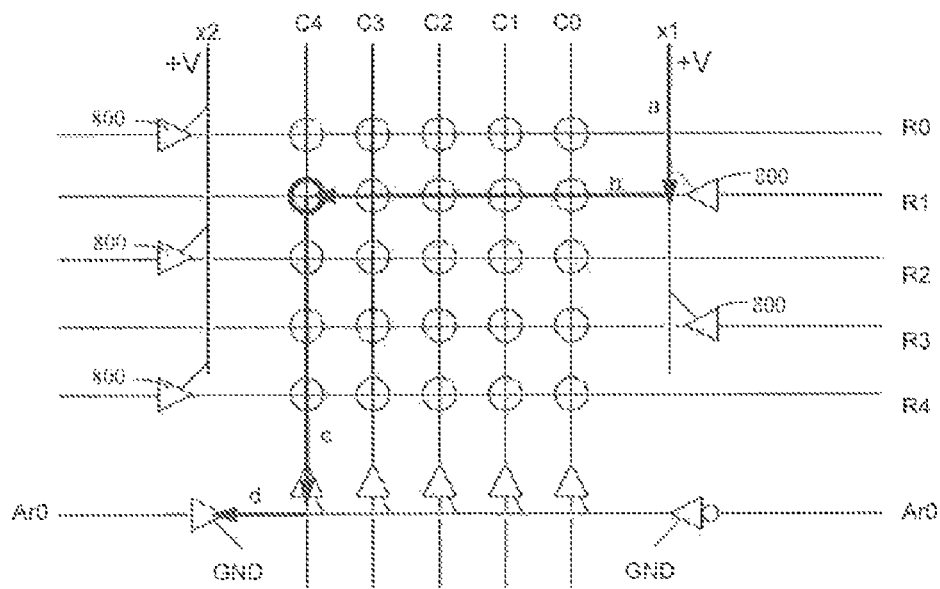
FIG. 8 illustrates a cross-point memory array circuit including split-row decoders with path switching.

In one embodiment, the present invention is modified to work with split-driver/decoder memory array devices. FIG. 8 depicts an array having a row decoder split between the left and right sides of the array. The row decoder, not shown, may be any suitable decoder circuit capable of driving the inputs of the depicted row drivers 800. Because the rows alternate between the two sides, the lowest row address bit Ar0 determines the decoder half that is activated for a given row address. When Ar0 is low, the row drivers 800 on the left side of the array are active, and, when Ar0 is high, the row drivers 800 on the right side of the array are active. In other embodiments, Ar0 may select the left side of the array when high, and vice versa. As is shown in FIG. 6, if the circuits and layouts shown in FIGS. 1 through 5 were used in this case, the distance of the path through a selected bit would vary as a function of the column being addressed because of the variation in the horizontal segments (b) and (d). To compensate for having the row decoder being on each side of the array, the GND bus is switchable so that either the right end or the left end may connected to GND. In the memory access operation depicted in FIG. 8, row R1 is selected (i.e., Ar0 is high) and the driver switch is turned on to connect R1 to +V. Ar0 also turns on the GND switch in the bottom-left corner of the array, completing the path from the selected bit through segment (d). Note that the path resistance between the two GND switches and the actual power supply ground voltage point in the circuit may not contribute a difference in the total path resistance. Likewise, the path resistance between the two +V inputs (x1 and x2) and the actual power supply positive voltage point in the circuit may not contribute a difference in the total path resistance. To accomplish this, the connection from the power supply voltage points (GND or +V) may be equivalent or negligible. To make them negligible, very large, low-resistance traces may be used such that the resistance of these wires contributes negligible resistance compared to the resistance of the wires in the array and through the switches. To make them equivalent, calculated cross-section, distance, and material choices for the power supply connection wires may be used to make the resistance from a common power supply point to the array equal in resistance (i.e., the resistance component attributable to the power supply connection added to the total path is the same regardless of which path through the array is selected). Referring to FIG. 8, to ensure the wiring from the power supply does not cause a path resistance difference, a wire from point x1 to the supply and from point x2 to the supply may have generally equal resistance or, alternatively, such a low resistance that this low resistance is negligible compared to the resistance of the wiring within the array and the switches (i.e., from point x1 or x2 through the array). In one embodiment, the x1 and x2 points are connected with a wire having a constant resistance per unit distance and, from the midpoint of that connection, provide a single connection to the +V supply. The same power connection technique may be implemented for the GND paths. Both approaches will be clear to one skilled in the art.

In some embodiments, a first material or geometry is used for either the row or the column lines and a second material or geometry is used for the orthogonal lines. This configuration may occur, for example, because conductive lines disposed in layers below the storage cell layers are exposed to the subsequent processing steps of forming the memory cells, and thus may be limited to materials capable of withstanding those subsequent steps. Conductive lines disposed in layers above the storage cell layers, however, are not exposed to the storage cell processing steps, and thus may be formed from a wider variety of materials, including materials with more desirable properties. For example, copper may be used in layers above the storage cells for its lower resistivity, but may not be suitable for layers under the storage cells. The line resistance in one direction, therefore, may be negligible when compared to the other. Embodiment of the present invention may therefore include a power bus routed in one direction, parallel to one set of lines, to compensate for a non-negligible resistance in the first set of lines, while ignoring the resistance in a second, orthogonal set of lines. Such a partial application is depicted in FIG. 8.

Figure 9:
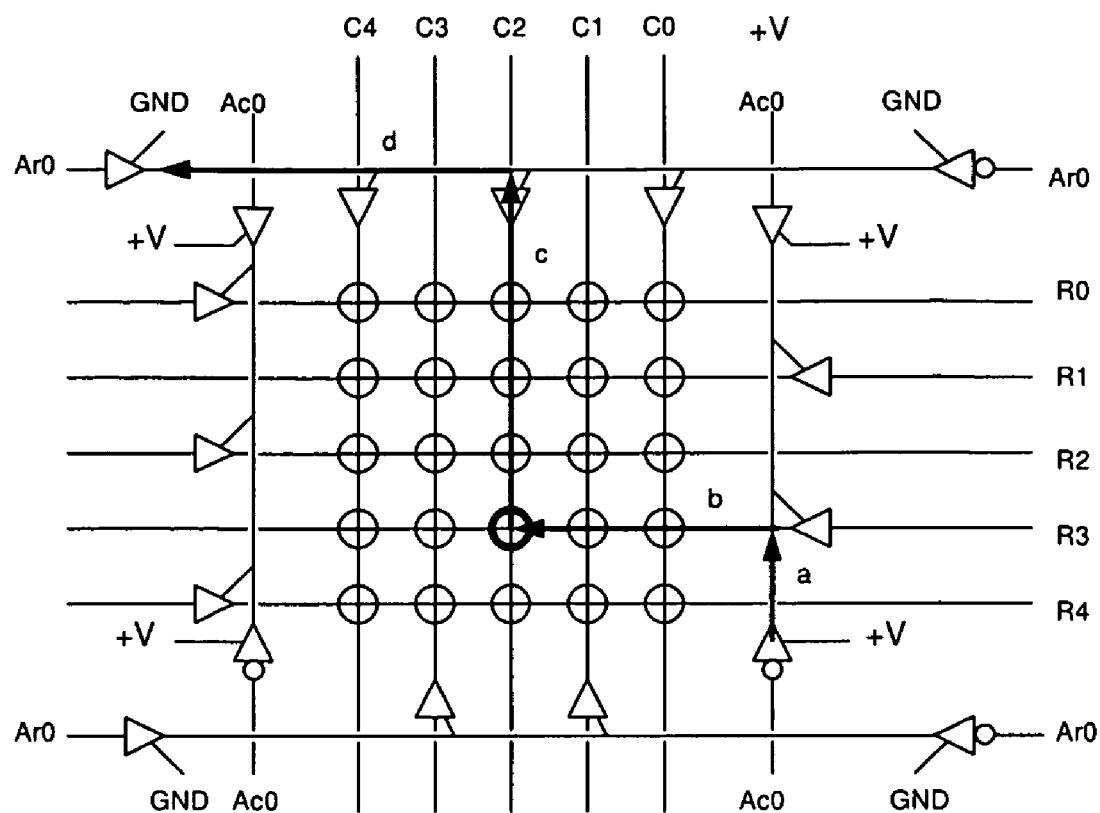
FIG. 9 illustrates a cross-point memory array circuit including split-row and column decoders and with path switching.

FIG. 9 illustrates a memory array having both the row and column decoders are split in two halves. In this case, the same logic applies, but in two dimensions with the lowest column address bit (Ac0) being used to select the column decoder half as well as the +V selection switches. Table 1 outlines the diagonally opposite corners and how they are utilized for the values of Ac0 and Ar0:

TABLE 1

| Ac0 | Ar0 | +V | GND |
|---|---|---|---|
| 0 | 0 | bottom left | top right |
| 0 | 1 | bottom right | top left |
| 1 | 0 | top left | bottom right |
| 1 | 1 | top right | bottom left |

The connections from the four +V points to the power supply and from the four GND points to the power supply may be made as described above for FIG. 8.

The array may be one of many tiles or sub-arrays in a larger device of an array within a 3-D arrangement of arrays or tiles. The storage cells can include transistors, field-emitters, diodes or any other device that conducts current better in one direction than the other for a given applied voltage. The storage element may be a fuse, and antifuse, a phase-change material, and/or a programmable field-emitter element. The phase change material may be a chalcogenide and may include a programmed resistivity that may be one of two or more resistance values, each resistance value corresponding to a stored bit in the storage cell. The programmable field-emitter element may include an element for which the resistance and/or the volume is changeable and programmable. The orientation of the array may be rotated, thereby making the rows be the columns and vice-versa, or the polarity of the voltages and direction of the steering elements in the storage bits may be reversed while still keeping within what is envisioned by the present invention.

The foregoing description of an example of preferred embodiments of the invention, and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

What is claimed is:

1. An electronic memory array comprising:
   a first plurality of generally parallel conductors each having a non-negligible resistance;
   a second plurality of generally parallel conductors, each having a non-negligible resistance, overlapping the first plurality of generally parallel conductors;
   a plurality of storage elements each disposed proximate a point of overlap between the first and second pluralities of generally parallel conductors;

one or more first power busses (i) generally parallel to the second plurality of generally parallel conductors and (ii) each having a non-negligible resistance; and one or more second power busses (i) generally parallel to the first plurality of generally parallel conductors and (ii) each having a non-negligible resistance wherein an address path for each storage element (i) is unique and (ii) traverses at least a portion of one of the first plurality of generally parallel conductors, at least a portion of one of the second plurality of generally parallel conductors, at least a portion of one of the first power busses, and at least a portion of one of the second power busses, and all storage element address paths have substantially equivalent voltage drops across the corresponding storage elements.

2. The electronic memory array of claim 1, wherein each first power bus receives, at one end only, voltage from a first voltage source, a voltage potential on the first power bus decreasing with increasing distance from the first voltage source, and wherein the first power bus supplies power to the first plurality of generally parallel conductors.

3. The electronic memory array of claim 2, wherein each second power bus receives, at one end only, voltage from a second voltage source, a voltage potential on the second power bus decreasing with decreasing distance from the second voltage source, and wherein the second power bus supplies power to the second plurality of generally parallel conductors.

4. The electronic memory array of claim 3, wherein first and second voltage sources are disposed at diagonally opposite corners of the electronic memory array.

5. The electronic memory array of claim 1, wherein the storage element is at least one of a fuse, an antifuse, a phase change material, and a programmable field-emitter element.

6. The electronic memory array of claim 2, further comprising a first driver for receiving power from the first power bus and supplying power to one of the first plurality of generally parallel conductors.

7. The electronic memory array of claim 6, wherein the first driver comprises a field-effect transistor.

8. The electronic memory array of claim 3, further comprising a second driver for receiving power from the second power bus and supplying power to one of the second plurality of generally parallel conductors.

9. The electronic memory array of claim 8, wherein the second driver comprises a field-effect transistor and a signal sense circuit.

10. The electronic memory array of claim 9, wherein the signal sense circuit determines a state of the storage element at by sensing at least one of a current through and a voltage on the storage element.

11. The electronic memory array of claim 3, further comprising a first driver on a first side of the electronic memory array and a second driver on a second, opposite side of the electronic memory array, the first and second drivers providing power to the first plurality of generally parallel conductors, wherein the second voltage source is connected to a first end of the second power bus when the first driver is active and to a second end of the second power bus when the second driver is active.

12. The electronic memory array of claim 2, further comprising a first driver on a first side of the electronic memory array and a second driver on a second, opposite side of the electronic memory array, the first and second drivers providing power to the second plurality of generally parallel conductors, wherein the first voltage source is connected to a first end of the first power bus when the first driver is active and to a second end of the first power bus when the second driver is active.

13. The electronic memory array of claim 2, wherein the first power bus has a resistivity per unit length approximately equal to that of one of the second plurality of generally parallel conductors.

14. The electronic memory array of claim 3, wherein the second power bus has a resistivity per unit length approximately equal to that of one of the first plurality of generally parallel conductors.

15. A method for addressing a storage element in an electronic memory array, the method comprising:

selecting one of a first plurality of generally parallel conductors each having a non-negligible resistance;

selecting one of a second plurality of generally parallel conductors, each having a non-negligible resistance, overlapping the first plurality of generally parallel conductors;

supplying power to the first plurality of generally parallel conductors with one or more first power busses;

supplying power to the second plurality of generally parallel conductors with one or more second power busses; and addressing one of a plurality of storage elements each disposed proximate a point of overlap between the first and second pluralities of generally parallel conductors, wherein an address path for each storage element (i) is unique and (ii) traverses at least a portion of one of the first plurality of generally parallel conductors, at least a portion of one of the second plurality of generally parallel conductors, at least a portion of one of the first power busses, and at least a portion of one of the second power busses, and all storage element address paths have substantially equivalent voltage drops across the corresponding storage elements.

16. The method of claim 15, wherein each first power bus receives, at one end only, voltage from a first voltage source, a voltage potential on the first power bus decreasing with increasing distance from the first voltage source.

17. The method of claim 16, wherein each second power bus receives, at one end only, voltage from a second voltage source, a voltage potential on the second power bus decreasing with decreasing distance from the second voltage source.

18. The method of claim 17, wherein first and second voltage sources are disposed at diagonally opposite corners of the electronic memory array.

19. The method of claim 15, wherein the storage element is at least one of a fuse, an antifuse, a phase change material, and a programmable field-emitter element.

20. The method of claim 16, further comprising switching the voltage received from the first voltage source from a first end of the first power bus to a second end of the first power bus based on a received column address.

21. The method of claim 17, further comprising switching the voltage received from the second voltage source from a first end of the second power bus to a second end of the second power bus based on a received row address.

* * * * *